United States Patent
Platz

(10) Patent No.: US 6,416,341 B1
(45) Date of Patent: Jul. 9, 2002

(54) PLASTIC MOLDING WITH ELECTRICAL CONTACTS

(75) Inventor: Di Reinhold Platz, Mühltal (DE)

(73) Assignees: Platz, Frankfurt am Main; Ticona GmbH, Kelsterbach, both of (DE)

(*) Notice: Subject to any disclaimer, the term of this patent is extended or adjusted under 35 U.S.C. 154(b) by 0 days.

(21) Appl. No.: 09/634,785

(22) Filed: Aug. 9, 2000

(30) Foreign Application Priority Data

Aug. 13, 1999 (DE) .......................................... 199 37 865

(51) Int. Cl.[7] .............................................. H01R 13/62
(52) U.S. Cl. ..................................................... 439/264
(58) Field of Search .......................... 439/264, 78, 76.1

(56) References Cited

U.S. PATENT DOCUMENTS

| | | | | |
|---|---|---|---|---|
| 4,017,143 A | * | 4/1977 | Knowles | 439/873 |
| 4,954,089 A | * | 9/1990 | Jensen et al. | 439/76 |
| 5,270,903 A | * | 12/1993 | McMichen et al. | 361/760 |
| 5,418,689 A | * | 5/1995 | Alpaugh et al. | 361/792 |
| 5,840,402 A | * | 11/1998 | Roberts et al. | 428/131 |
| 5,934,913 A | * | 8/1999 | Kodama | 439/76.1 |

FOREIGN PATENT DOCUMENTS

| | | | | |
|---|---|---|---|---|
| DE | 41 42 138 | | 4/1993 | |
| DE | 295 21 258 | | 12/1996 | |
| DE | 198 34 348 | | 2/2000 | |
| EP | 0 848 584 | | 6/1998 | |
| GB | 2 039 160 | * | 7/1980 | .......... H01R/13/62 |

* cited by examiner

Primary Examiner—Tulsidas Patel
(74) Attorney, Agent, or Firm—Connolly Bove Lodge & Hutz LLP

(57) ABSTRACT

A plastic molding which on one side has on its surface electrical conductor tracks into which contact pins are inserted, part of these contact pins protruding from the surface with the electrical conductor tracks and part of the contact pins penetrating through the layer of plastic and protruding out on the other, opposite side as well as a subassembly comprising a housing of at least one thermoplastic material or plastic blend, which has at a selected location on its inner side on the surface electrical conductor tracks, into which contact pins are inserted, part of these contact pins protruding from the surface with the electrical conductor tracks and part of the contact pins penetrating through the layer of plastic of the housing and protruding out exclusively or additionally on the opposite outer side, as well as at least one electrical or electronic device.

3 Claims, 1 Drawing Sheet

PLASTIC MOLDING WITH ELECTRICAL CONTACTS

BACKGROUND OF THE INVENTION

The present invention relates to a molding of thermoplastic material with electrical contacts and to a process for its production. The molding according to the invention contains integrated conductor tracks and contact pins and can be used in particular as a housing for electrical or electronic devices.

Widely known are boards for electric circuits which bear on their surface electrical conductor tracks to which electronic components such as transistors, relays, computer chips etc. are soldered. The boards are generally produced from an electrically insulating plastic.

Also known are plug-in connectors of plastic, which have on one side contact pins or contact tubes which are molded or fitted into the plastic. Fastened on the other (rear) side of the contact pins or contact tubes are electrical lines, which are generally brought together to form a cable. These plug-in connectors do not, however, contain electrical conductor tracks which interconnect various of the contact pins or contact tubes.

Components for electrical or electronic devices are usually constructed for example in the form of an electric motor, an electric circuit etc. surrounded by a housing. The electrical contacting in this case usually takes place through a cable, which is led through an opening in the housing and is connected to the electrical or electronic devices directly or with the aid of a plug-in connector.

In mechanical and automotive engineering in particular, there are many examples of such subassemblies: distribution boxes, boxes for fuses and boxes for special vehicle electronics, in each case comprising a housing, a board with electric circuits and components and a separate power supply lead, which is led through an opening in the housing, as well as housings for door locks, window lifting drive mechanisms or windshield wiper drive mechanisms, which contain, inter alia, an electric motor and a power supply lead led through the housing.

A problem which arises here is often inadequate protection of the electrical or electronic components against moisture, since the cable bushings of the power supply leads usually do not fit exactly, or if so not permanently, and no separate sealing is carried out. On the other hand, the threading in of the power supply lead and the connection of the end of the cable of the power supply lead to the electrical or electronic devices that are located, and possibly fastened, inside the housing mean that many working steps are necessary for assembly.

SUMMARY OF THE INVENTION

The object was therefore to find an alternative possibility for the production of electrical or electronic subassemblies which as far as possible also simplifies assembly.

This object is achieved according to the invention by providing a plastic molding which is produced by the injection-molding process and contains on one side electrical conductor tracks, into or through which contact pins are inserted, part of the contact pins protruding out on the other, opposite side.

The invention therefore relates to a plastic molding which on one side contains on its surface electrical conductor tracks into which contact pins are inserted, part of these contact pins protruding from the surface with the electrical conductor tracks and part of the contact pins penetrating through the layer of plastic and protruding out on the other, opposite side.

The invention also relates to a process for producing the molding according to the invention, which is described in more detail below, and in particular to the use of the molding according to the invention as a housing for electrical or electronic devices.

BRIEF DESCRIPTION OF THE DRAWINGS

Novel features and advantages of the present invention in addition to those mentioned above will become apparent to persons of ordinary skill in the art from a reading of the following detailed description in conjunction with accompanying drawings wherein.

DETAILED DESCRIPTION OF THE INVENTION

Figure 1:
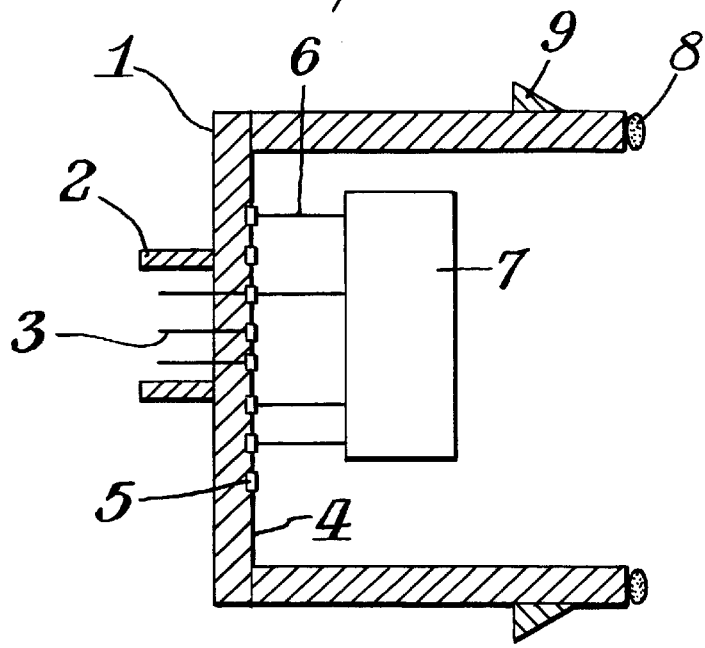
FIG. 1 is a cross sectional view of a plastic housing with electrical contacts, according to the present invention.

The molding according to the invention combines the functions of a housing and a board. Its advantages are, for example, that the housing does not need an opening for leading the power supply lead through and consequently complete exclusion of moisture can be ensured inside the housing, where the conductor tracks and the electrical or electronic device are located. Power supply leads can, moreover, be easily fitted onto the outside of the housing, on plug-in connections formed by contact pins protruding out.

The design of the conductor tracks and, in addition, fitting of electronic parts or subassemblies onto the contact pins allow an electric circuit to be created inside the housing. If, apart from the electric circuit, the housing encloses electrical components, for example an electric motor, the contact to the electrical component can take place through a separate plug-in connection, i.e. by a cable and a plug which is fitted onto contact pins inside the housing, but it is more advantageous for the electrical component itself to be fitted directly onto the contact pins. With the last variant in particular, several working steps can be saved.

The molding according to the invention consists of at least one thermoplastic material or plastics blend and may optionally also be reinforced. For applications in mechanical and automotive engineering, plastics which are particularly preferred are polyacetals, in particular polyoxymethylene homopolymers and copolymers (POM), polyesters, in particular polyethylene terephthalate (PET) and polybutylene terephthalate (PBT), polyaryl ethers and sulfides, in particular polyphenylene oxide (PPO) and sulfide (PPS), polyolefins, in particular high- and low-molecular weight polyethylene (PE) and polypropylene (PP), polyamides (PA), polycarbonates (PC), cycloolefinic homopolymers and copolymers (COC) as well as liquid-crystal polymers (LCP). Preferred plastics blends are high impact mixtures, for example with thermoplastic elastomers or acrylonitrile-styrene blends, but also mixtures of the aforementioned plastics with one another.

The thermoplastic material may contain customary additives and additions such as stabilizers, antioxidants, flame retardants etc. as well as colorants, fillers and reinforcing agents. To ensure particular strength of the molding, it may also be advantageous to use as a reinforcing agent, in addition or in place of other fine particles with an average particle length <0.5 mm, in particular chopped glass strands, particles with an average particle length >0.5 mm, in particular >1 mm or even >5 mm, for example continuous glass strand-reinforced polyolefin or polyamide. In particular if carbon black is added for black coloration of the molding, it must be ensured that the plastic does not become conductive and cause leakage currents or short-circuits.

The conductor tracks may be applied to the surface of the plastic by generally known methods such as hot embossing or electroplating techniques. For the purpose of saving working steps in the production of the molding according to the invention, application by impressing metal foils is to be preferred. Contact pins are shot into these conductor tracks at the predetermined locations. This optionally takes place by ending up with the contact pin, set in the plastic, protruding with one end from the conductor track or passing through the layer of plastic and protruding with one end out of the plastic on the opposite side, the other end of the contact pin terminating with the surface of the conductor track or additionally also protruding from the latter.

The process for producing the molding according to the invention becomes particularly economical if it is carried out in one mold. For example, the blank may be formed in an injection mold, holes into which the contact pins are later shot advantageously being created in the plastic part by the arrangement of pins on the inner side of the mold. The conductor tracks are then applied to the blank by hot embossing and the contact pins are finally shot into them.

A similarly advantageous variant of the process comprises placing a foil with the conductor tracks and the fitted-in contact pins into the injection mold and then encapsulating it with the plastic.

The contact pins are generally of a simple cylindrical form. To improve the contact with the conductor track, however, it is advantageous if the contact pins have a greater cross section at the location with which they are in contact with the conductor track after firing in. Pins of this type are widely known. To improve the contacting, the connection between the contact pin and the conductor track may be covered with a conductive adhesive or, in particular in the case of glass fiber-reinforced plastics, covered with a solder. In the case of contact pins which pass through the plastic, the adhesive bonding or soldering also prevents moisture from diffusing through the hole in which the contact pin is fitted and getting into the interior of the housing.

The thickness of the conductor tracks is to be selected according to the specific requirements of an application. Thicknesses of 35 to 100 $\mu$m are customary. For particular protection, the conductor tracks may also be covered with a further layer of plastic, the plastic used for this purpose not having to be the same as that from which the molding is produced.

The molding according to the invention is used, for example, as a door lock housing, as a housing for window lifting or windshield wiper drive mechanisms, in the form of a door module with integrated electrical lines and contacts, for tank sensors or for distribution boxes. Depending on the use, it may be necessary here for the molding to be additionally provided with a seal or fastening elements. This advantageously likewise takes place in one operation with the production of the molding, for example in a multi-component injection-molding process, but may also take place in a separate working step.

The following exemplary embodiments are intended to illustrate the invention for a person skilled in the art, without however being of a restrictive character.

FIG. 1 shows in cross section a plastic housing 1 which has toward the outside a plug-in connection 2 with three outwardly protruding contact pins 3. On the inner side 4 there are conductor tracks 5, with contact pins 6, onto which an electronic subassembly 7 is fitted. The plastic housing 1 is provided with a seal 8 and fastening elements 9.

Figure 2:
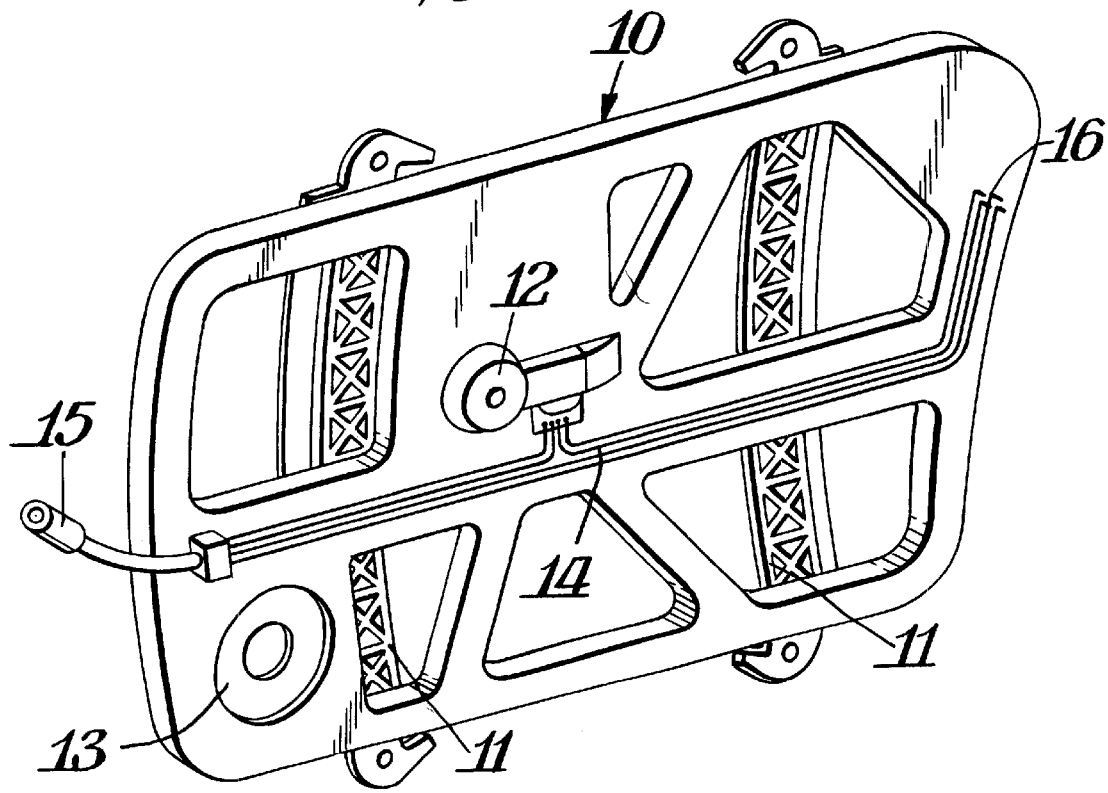
FIG. 2 is a prospective view of a one-piece door modular, according to the present invention.

FIG. 2 shows a one-piece door module 10 of plastic with integrated window lifting rails 11, a mount 12 for a window lifting drive mechanism with motor and a depression 13 for a loudspeaker. The door module has impressed conductor tracks 14, which run from a central power supply 15 to the mount 12 and to other items of the door module and end there at contact pins 16, onto which electrical or electronic devices (not shown in the figure), for example the window lifting drive mechanism with motor, can be fitted. Since the window lifting drive mechanism is to be attached to the door module on the rear side, the contact pins 16 shot into the mount 12 terminate on this side flush with the conductor tracks and only their ends covered with conductive adhesive can be seen.

What is claimed is:

1. A plastic molding comprising a three dimensional housing or door module including at least one layer of thermoplastic material selected from the group consisting of polyacetal, polyester, polyaryl either, polyaryl sulfide, polycarbonate, cyloolefinic hompolymer or copolymer, liquid crystal polymer and a blend thereof, electrical conductor tracks positioned on one side surface of the layer, shot-in electrical contact pins extending through the layer and into the conductor tracks, and a portion of the shot-in electrical contact pins protruding from the layer on a side surface thereof opposite the side surface on which the electrical conductor tracks are positioned, and at least one electrical or electronic device fitted onto the contact pins and enclosed by the housing or door module.

2. A plastic molding as in claim 1, wherein the electrical or electronic device is selected from the group consisting of electric-motors and drive-mechanism units and electronic components.

3. A process for producing a molding as claimed in claim 1, wherein a blank is formed in an injection mold, holes being created in the plastic part by the arrangement of pins on the inner side of the mold, conductor tracks being applied to the blank by hot embossing or foil-insert molding and contact pins subsequently being shot through the conductor tracks into the prefabricated holes.

\* \* \* \* \*